United States Patent [19]
Kimizuka et al.

[11] Patent Number: 5,877,082
[45] Date of Patent: Mar. 2, 1999

[54] METHOD OF MANUFACTURING SEMICONDUCTOR DEVICE WITHOUT PLASMA DAMAGE

[75] Inventors: Naohiko Kimizuka; Shinya Ito, both of Tokyo, Japan

[73] Assignee: NEC Corporation, Tokyo, Japan

[21] Appl. No.: 851,314

[22] Filed: May 5, 1997

[30] Foreign Application Priority Data

Jun. 14, 1996 [JP] Japan .................................. 8-154261

[51] Int. Cl.$^6$ .................................................. H01L 21/283
[52] U.S. Cl. ...................... 438/625; 438/627; 438/629; 438/636; 438/656
[58] Field of Search .................................... 438/622, 625, 438/627, 629, 636, 653, 656, 669, 671

[56] References Cited

U.S. PATENT DOCUMENTS

| | | | |
|---|---|---|---|
| 4,885,259 | 12/1989 | Osinski et al. | 438/303 |
| 5,472,895 | 12/1995 | Park | 438/302 |
| 5,512,514 | 4/1996 | Lee | 438/626 |
| 5,656,543 | 8/1997 | Chung | 438/625 |

FOREIGN PATENT DOCUMENTS

| | | |
|---|---|---|
| 63-25976 | 2/1988 | Japan . |
| 63-43349 | 2/1988 | Japan . |
| 63-86453 | 4/1988 | Japan . |
| 5-343398 | 12/1993 | Japan . |
| 7-240467 | 9/1995 | Japan . |
| 9-283619 | 10/1997 | Japan . |

*Primary Examiner*—T. N. Quach
*Attorney, Agent, or Firm*—Sughrue, Mion, Zinn, Macpeak & Seas, PLLC

[57] ABSTRACT

In a method of manufacturing a semiconductor device, a conductive film is formed for a plurality of wiring patterns on a first insulating film and a second insulating film is formed on the conductive film. The second insulating film is patterned to be adaptive for the plurality of wiring patterns and then anisotropically etching is performed to the conductive film using the patterned second insulating film a mask such that a part of the conductive film is remained in a thickness direction of the conductive film. Subsequently, side wall insulating films are formed on side walls of the etched conductive film and then the conductive film is completely patterned for the plurality of wiring patterns using the side wall insulating films and the patterned second insulating film as a mask. In this case, the step of anisotropically etching the conductive film includes stopping the etching when the etching is performed by a predetermined depth with respect to a film thickness of the conductive film. Alternatively, when a lower layer of the conductive film is detected, the etching may be stopped.

22 Claims, 14 Drawing Sheets

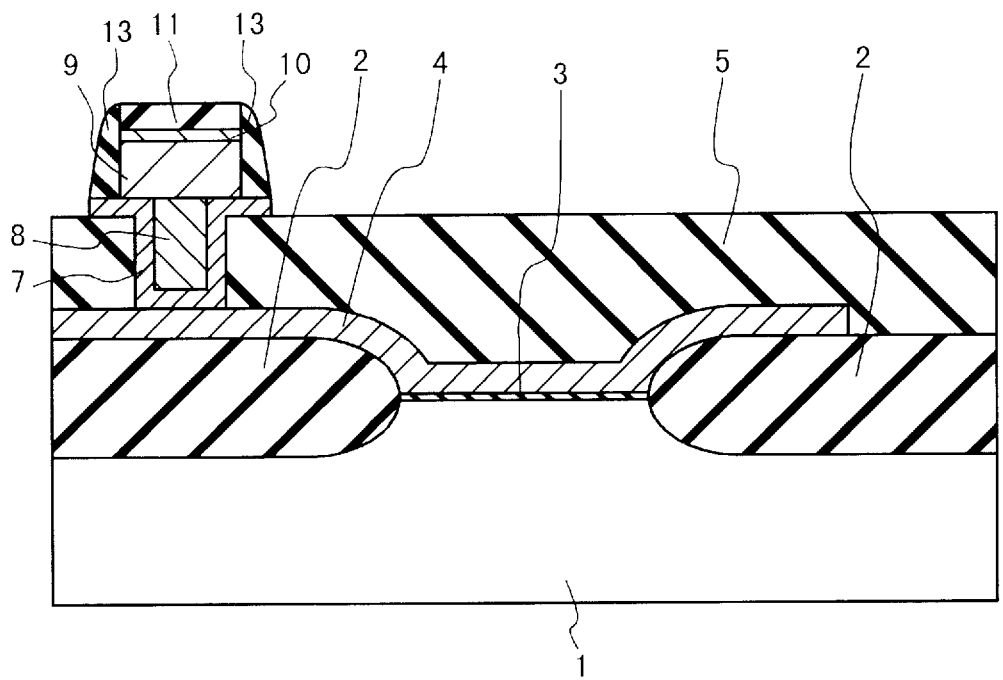

METHOD OF MANUFACTURING SEMICONDUCTOR DEVICE WITHOUT PLASMA DAMAGE

BACKGROUND OF THE INVENTION

1. Field of the Invention

The present invention relates to a manufacturing method of a semiconductor device, and more particularly to a manufacturing method of a semiconductor device in which damage of a gate oxide film due to charge-up phenomenon in a reactive ion etching method can be reduced when wirings are formed.

2. Description of Related Art

In a conventional semiconductor device, in order to perform anisotropic etching to a wiring film composed of material of aluminium or the like, a reactive ion etching (RIE) method is generally used, because of excellent perpendicular workability and fine fabrication. In the reactive ion etching method, ions generated in plasma are used. Therefore, electrons, positive charge ions, negative charge ions are contained in an ambience. In a case where the semiconductor devices such as a MOS-type field effect transistor are manufactured to have a gate electrode, these electrically charged particles flow into the gate electrode through a contact during the etching process. As a result, since high voltage is applied to the gate electrode, a thin gate oxide film is sometimes degraded and destroyed. The problem is called plasma damage and is one of the causes that the reliability is reduced when the semiconductor device is manufactured. The larger the lateral area of the wiring pattern connected to the gate electrode is, the more conspicuous this plasma damage is.

In a case where a metal wiring pattern is formed by use of the reactive ion etching method, various manufacturing methods are proposed to prevent the plasma damage of the gate oxide film in the plasma process. For example, as shown in the technique of FIG. 1, which is described in Japanese Laid Open Patent Disclosure (JP-A-Showa 63-25976), a protection diode is previously formed by layers 22 and 27, and a gate electrode 25 under a contact hole 29a is connected to the protection diode. Therefore, the electric charges generated when a through hole 30 is formed by the plasma etching process are directed to a silicon substrate 21 through the protection diode. This protection diode is also effective when a wiring film is etched to form a wiring pattern. The wiring pattern to be formed is connected to the protection diode via the contact hole 30 and the gate electrode 25. For this reason, charging up of the gate electrode can be restrained.

On the other hand, the method is proposed in which the plasma damage is reduced by adding a new manufacturing process without adding a functional element like the protection diode. FIGS. 2A to 2C are plan views illustrating the processes of the manufacturing method of the semiconductor device which is described in Japanese Laid Open Patent Disclosure (JP-A-Heisei 5-343398). In this method, an aluminium film is connected to a gate electrode through a contact 41. First, as shown in FIG. 2A, the aluminium film is etched by the reactive ion etching method using a photoresist as a mask such that a pattern 42 is removed. As a result, patterns 43a and 43b are left. The pattern 43a is connected to the gate electrode through the contact hole 41. In this case, the etching is performed such that the gate electrode is not charged up, i.e., such that the area of the pattern 42 becomes as small as possible.

Next, as shown in FIG. 2B, the aluminum film other than the pattern 43a is etched by the reactive ion etching using a photoresist as a mask so as to form wiring patterns 44. In this case, the pattern 43a on the contact hole 41 is separated from the aluminium wiring patterns 44. Also, because the surface area of the pattern 43a is very small, the injection of charged particles into the gate electrode can be restrained.

Finally, as shown in FIG. 2C, a tungsten film 45 is deposited by use of a selective CVD method such that separated aluminium wiring patterns are connected to each other. In this way, a wiring pattern is completed.

However, as described below, there are problems in the above-mentioned conventional manufacturing methods of the semiconductor device. First, in the conventional manufacturing method which is shown in FIG. 1, because the protection diode must be always formed, the required layout area increase. As a result, an integration density decreases. Also, because the wiring patterns must be always connected to either protection diode, the design of a circuit is greatly constrained.

On the other hand, in the conventional manufacturing method which is shown in FIGS. 2A to 2C, the lithography process needs to be executed many times, so that the manufacturing process becomes complicated. Therefore, it is difficult to reduce the number of manufacturing processes, and it is also difficult to avoid the rise of cost. Also, because an isolation pattern on the contact hole and patterns other than the isolation pattern are connected after the wiring film is patterned, a short circuit is easily produced in the high-density integrated circuit in which the separation between the wiring patterns is narrow, when the tungsten film is formed.

That is, these conventional techniques are not suitable for formation of fine patterns and high density integration.

SUMMARY OF THE INVENTION

The present invention is accomplished in the light of the above circumstances. Therefore, an object of the present invention is to provide a manufacturing method of a semiconductor device in which damage to a gate oxide film because of a charge up phenomenon during a plasma process for forming metal wiring patterns can be prevented.

Another object of the present invention is to provide a manufacturing method and a semiconductor device in which it is possible to improve the reliability of a MOS-type field effect transistor.

In order to achieve an aspect of the present invention, a method of manufacturing a semiconductor device, includes the steps of:

forming a conductive film for a plurality of wiring patterns on a first insulating film;

forming a second insulating film on the conductive film;

patterning the second insulating film to be adaptive for the plurality of wiring patterns;

anisotropically etching the conductive film using the patterned second insulating film a mask such that a part of the conductive film is remained in a thickness direction of the conductive film;

forming side wall insulating films on side walls of the etched conductive film; and completely patterning the conductive film for the plurality of wiring patterns using the side wall insulating films and the patterned second insulating film as a mask.

In this case, the step of anisotropically etching the conductive film includes stopping the etching when the etching is performed by a predetermined depth with respect to a film thickness of the conductive film. Also, the step of forming a conductive film includes forming a first conductive layer on the first insulating film, and forming a second conductive layer on the first conductive layer. Here, the first conductive layer may be formed of aluminium and the second conductive layer may be titanium nitride to function as a reflection preventing film.

When a contact hole is formed to pass through the first insulating film to another conductive layer which is formed under the first insulating film, the contact hole is filled with a contact conductive film such that the other conductive layer can be connected to the conductive film.

In a case where the step of forming the conductive film includes forming a first conductive layer on the first insulating film, forming a second conductive layer on the first conductive layer, and forming a third conductive layer of the second conductive layer, the step of anisotropically etching the conductive film includes stopping the etching when the etching reaches the first conductive layer. Here, the second conductive layer may be formed of aluminium and the third conductive layer may be titanium nitride to function as a reflection preventing film. When a contact hole is formed to pass through the first insulating film to another conductive layer which is formed under the first insulating film, the contact hole is filled with a contact conductive film, wherein the first conductive layer is a part of contact conductive film.

In order to achieve another aspect of the present invention, a method of manufacturing a semiconductor device, includes the steps of:

forming a first insulating film on a first conductive film;

forming a contact hole to pass through the first insulating film to the first conductive film;

filling the contact hole with a contact conductive film;

forming a second conductive film for a plurality of wiring patterns on the first insulating film and the contact hole filled with the contact conductive film;

forming a second insulating film on the second conductive film;

patterning the second insulating film to be adaptive for the plurality of wiring patterns;

anisotropically etching the second conductive film using the patterned second insulating film a mask such that a part of the second conductive film is remained in a thickness direction of the second conductive film;

forming side wall insulating films on side walls of the etched second conductive film; and completely patterning the second conductive film for the plurality of wiring patterns using the side wall insulating films and the patterned second insulating film as a mask.

In order to achieve still another aspect of the present invention, a method of manufacturing a semiconductor device, includes the steps of:

forming a first insulating film on a first conductive film;

forming a contact hole to pass through the first insulating film to the first conductive film;

forming a first contact conductive film on the first insulating film such that the first contact conductive film covers a surface of the first conductive film within the contact hole and side walls of the contact hole;

filling a remaining portion of the contact hole with a second contact conductive film;

forming a second conductive film for a plurality of wiring patterns on the first contact conductive film;

forming a second insulating film on the second conductive film;

patterning the second insulating film to be adaptive for the plurality of wiring patterns;

anisotropically etching the second conductive film using the patterned second insulating film a mask;

stopping the etching when the etching is performed to the second conductive film to expose the first contact conductive film;

forming side wall insulating films on side walls of the etched second conductive film; and completely patterning the first contact conductive film for the plurality of wiring patterns using the side wall insulating films and the patterned second insulating film as mask.

BRIEF DESCRIPTION OF THE DRAWINGS

FIGS. 4A to 4G are cross sectional views which show a manufacturing method of a semiconductor device according to the second embodiment of the present invention.

DESCRIPTION OF THE PREFERRED EMBODIMENTS

A manufacturing method of a semiconductor device of the present invention will be described below in detail with reference to the attached drawings.

Figure 1:
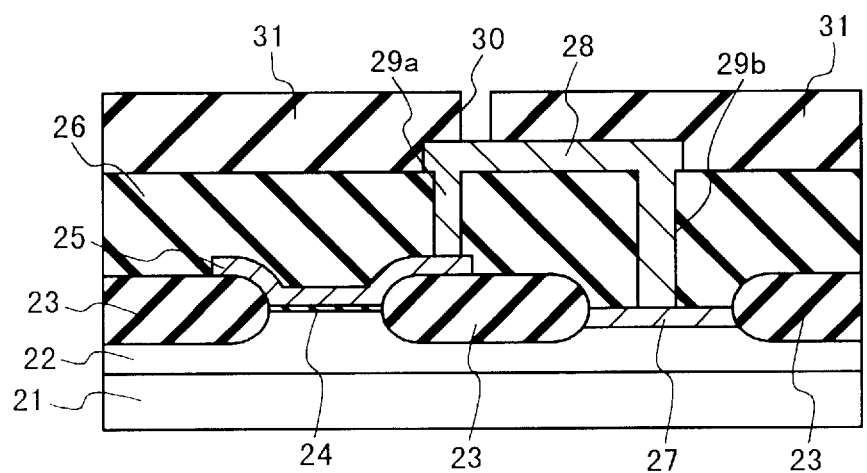
FIG. 1 is a cross sectional view which shows the structure of the first conventional example of a manufacturing method of a semiconductor device.
Figure 2A:
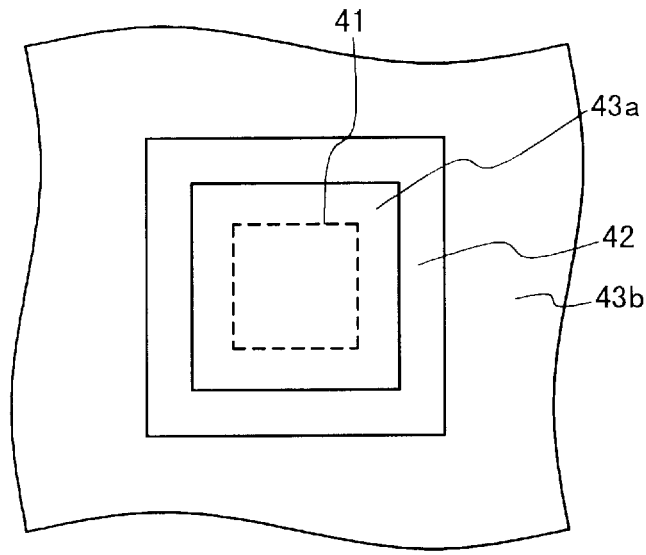
FIGS. 2A to 2C are plan views which show wiring patterns in the second conventional example of a manufacturing method of a semiconductor device.
Figure 2B:
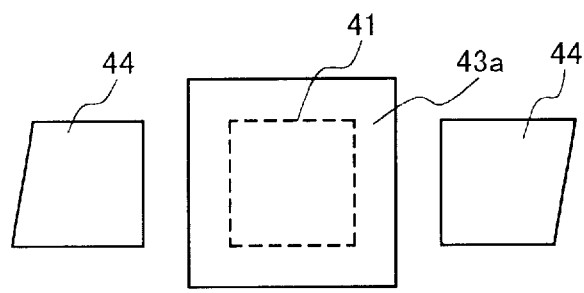
Figure 2C:
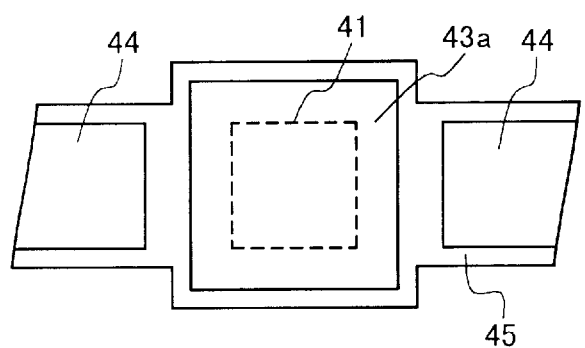
Figure 3A:
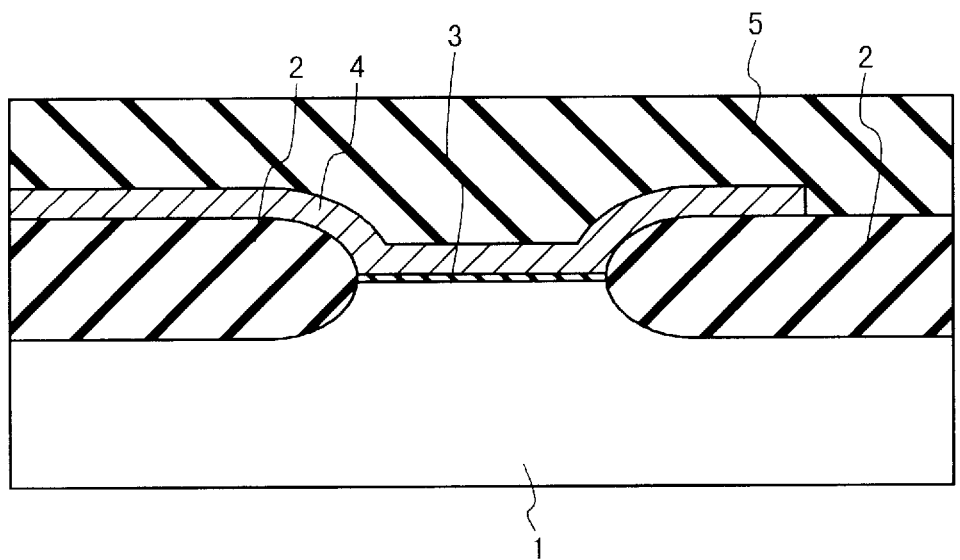
FIGS. 3A to 3G are cross sectional views which show a manufacturing method of a semiconductor device according to the embodiment of the present invention.

FIGS. 3A to 3G are cross sectional views to explain a manufacturing method of a semiconductor device according to the first embodiment of the present invention. First, as shown in FIG. 3A, on a silicon substrate 1, element separation oxide films 2, a gate oxide film 3, a gate electrode 4 are formed in the order, to form a MOS-type field effect transistor. Then, a boron-phosphorus-silicate glass (BPSG) film 5 is formed to have a flat surface above the substrate 1 as an interlayer insulating film.

Figure 3B:
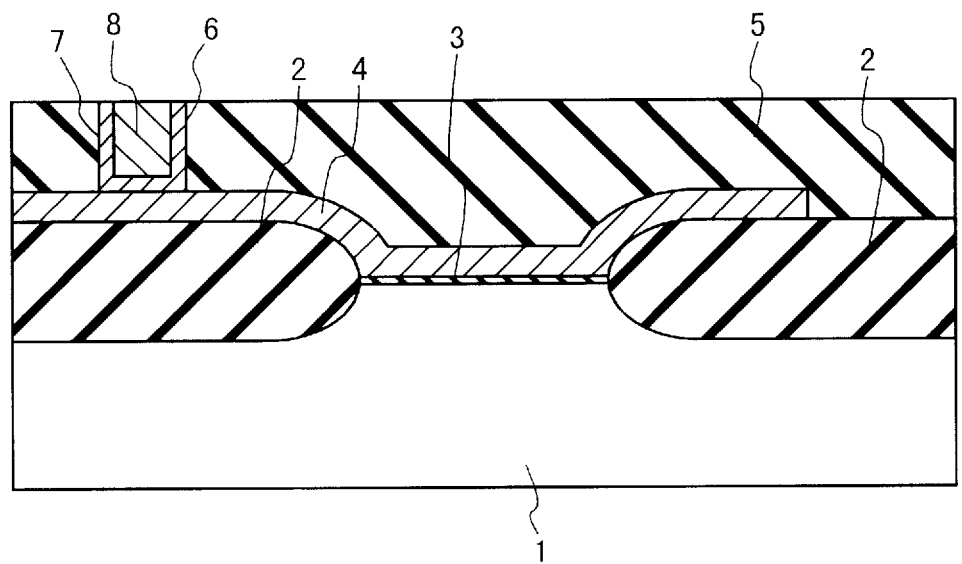

Next, as shown in FIG. 3B, after a contact hole 6 is formed to pass through the BPSG film 5 to a gate electrode of the MOS-type field effect transistor, a titanium nitride film 7 is deposited to have the thickness of 100 nm on the contact hole 6 and the BPSG film 5 in which this contact hole 6 is formed. By performing the CVD deposition of a tungsten film and a chemical mechanical polishing (CMP) method, the contact hole 6 is filled with a tungsten film 8. In this case, the titanium nitride film is removed from the surface of the BPSG film 5.

Figure 3C:
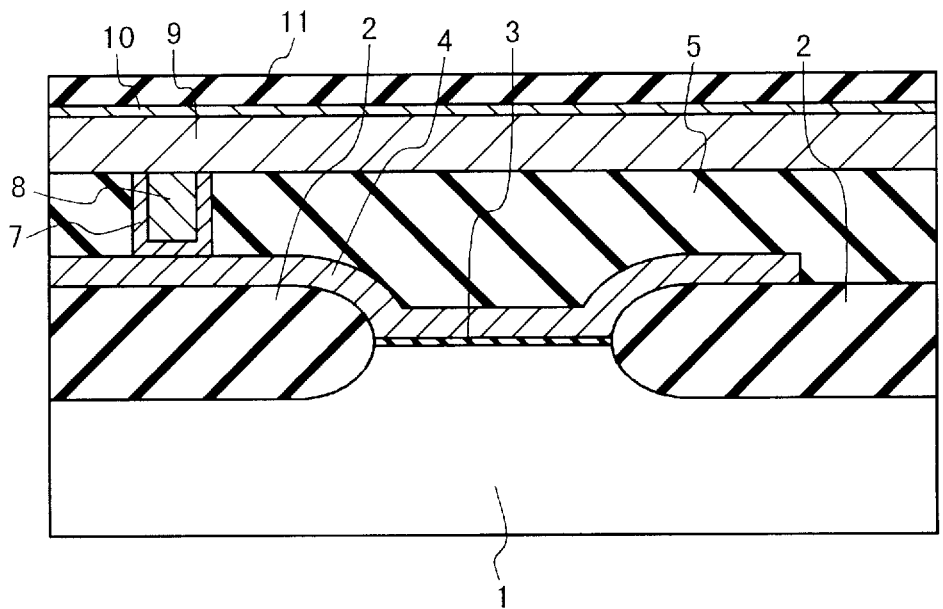

Next, as shown in FIG. 3C, an aluminium film 9 with the film thickness of 500 nm is formed as a wiring film, and then a titanium nitride film 10 with the film thickness of 50 nm is formed as a reflection preventing film on the aluminium film 9. Subsequently, a silicon oxide film 11 with the film thickness of 200 nm is formed on the titanium nitride film 10.

Figure 3D:
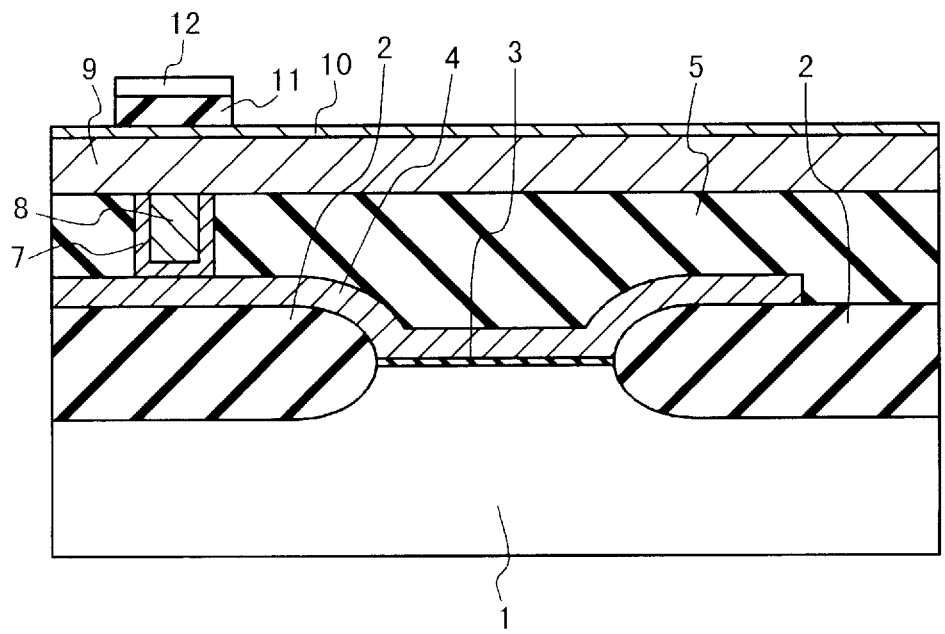

Next, as shown in FIG. 3D, a photo-resist film 12 is applied onto the top layer of the substrate, i.e., the silicon oxide film 11, and then the silicon oxide film 11 is patterned by use of the well-known photolithography technique and anisotropic plasma etching to correspond to desired wiring patterns.

Figure 3E:
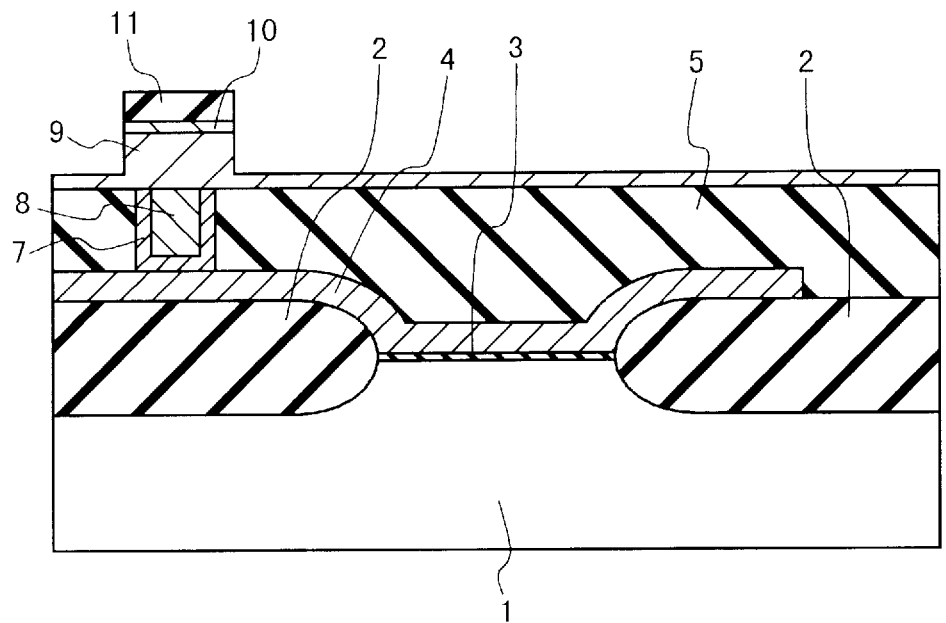

Next, as shown in FIG. 3E, after the photo-resist film 12 as the top layer is removed, the titanium nitride film 10 and the aluminum film 9 are patterned by use of an anisotropic plasma etching method using the silicon oxide film 11 as a mask. In this case, a part of the aluminum film 9 is left in the film thickness direction on the BPSG film to have the film thickness of about 100 nm. That is, the titanium nitride film 10 and the aluminium film 9 are etched by a predetermined depth. Therefore, the wiring patterns are connected without being completely separated. Because the wiring patterns are electrically connected by use of the aluminum film 9, the charges generated by plasma in the above-mentioned etching runs away to the substrate 1. Therefore, the gate oxide film 3 is not degraded nor destructed by the plasma damage.

Figure 3F:
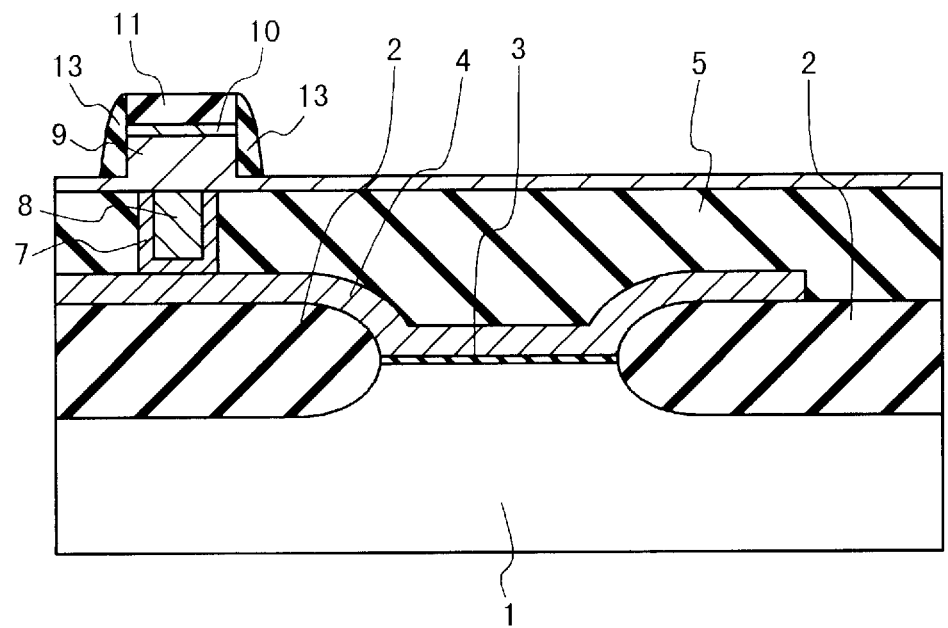

Next, as shown in FIG. 3F, a silicon oxide film is deposited to have a 100-nm film thickness, and then the silicon oxide film is etched back to form side wall insulating films 13 for the wiring pattern such that the side walls of the wiring pattern are covered.

Figure 3G:
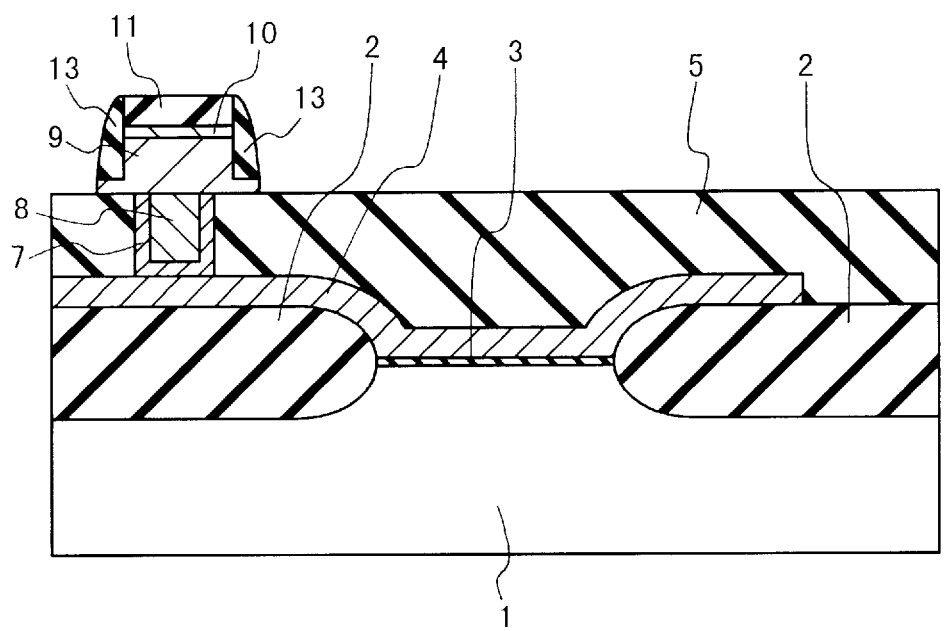

Next, as shown in FIG. 3G, the exposed part of the aluminium film 9 is anisotropically etched by the plasma etching, and the wiring patterns are completely separated from each other. That is, after the aluminium wiring patterns are separated, an over etching is performed. In this case, the top surface of the wiring pattern is covered by the silicon oxide film 11 and the side surfaces of the wiring pattern are covered by the side wall insulating films 13. Therefore, only a part of the side walls of the aluminium film 9 is exposed to the plasma. However, the side area of the wiring film exposed to the plasma is as small as about ⅓, compared with the case where the side wall insulating films 13 of silicon oxide are not formed on the side walls of the wiring pattern. Therefore, the plasma damage of the gate oxide film 3 can be remarkably reduced.

Next, the manufacturing processes of the semiconductor device according to the second embodiment of the present invention will be described in the case where completion of the etching can be easily detected using a lamination film as a conductive layer. FIGS. 4A to 4G are cross sectional views of the semiconductor device according to the second embodiment of the present invention.

Figure 4A:
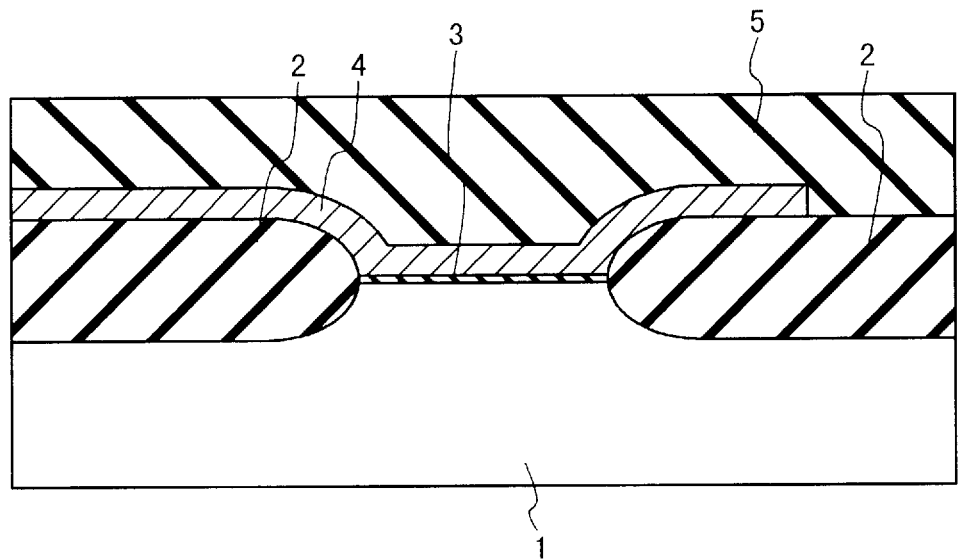

First, as shown in FIG. 4A, on a silicon substrate 1, element separation oxide films 2, a gate oxide film 3, and a gate electrode 4 are formed to form a MOS-type field effect transistor. Then, a boron-phosphorus-silicate glass (BPSG) film 5 is grown on the MOS-type field effect transistor to form a flat interlayer insulating film.

Figure 4B:
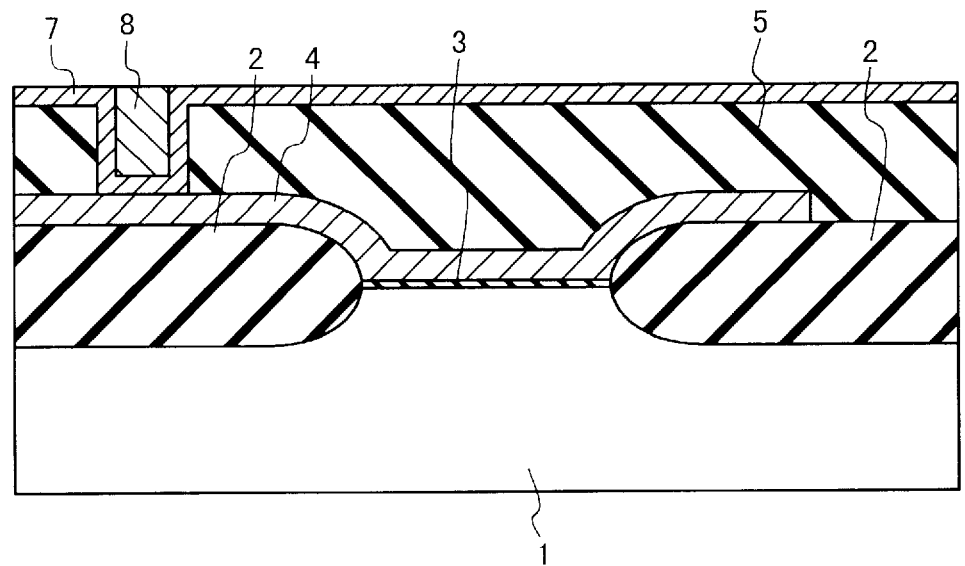

Next, as shown in FIG. 4B, after a contact hole 6 is formed to pass through the BPSG film 5 to a gate electrode 4 of the MOS-type field effect transistor, a titanium nitride film 7 is deposited to have the film thickness of 100 nm on the contact hole 6 and the BPSG film 5 in which this contact hole 6 is formed. Subsequently, by performing the CVD deposition of a tungsten film, the contact hole 6 is filled with the tungsten film 8. In this case, the titanium nitride film 7 is left on the BPSG film 5.

Figure 4C:
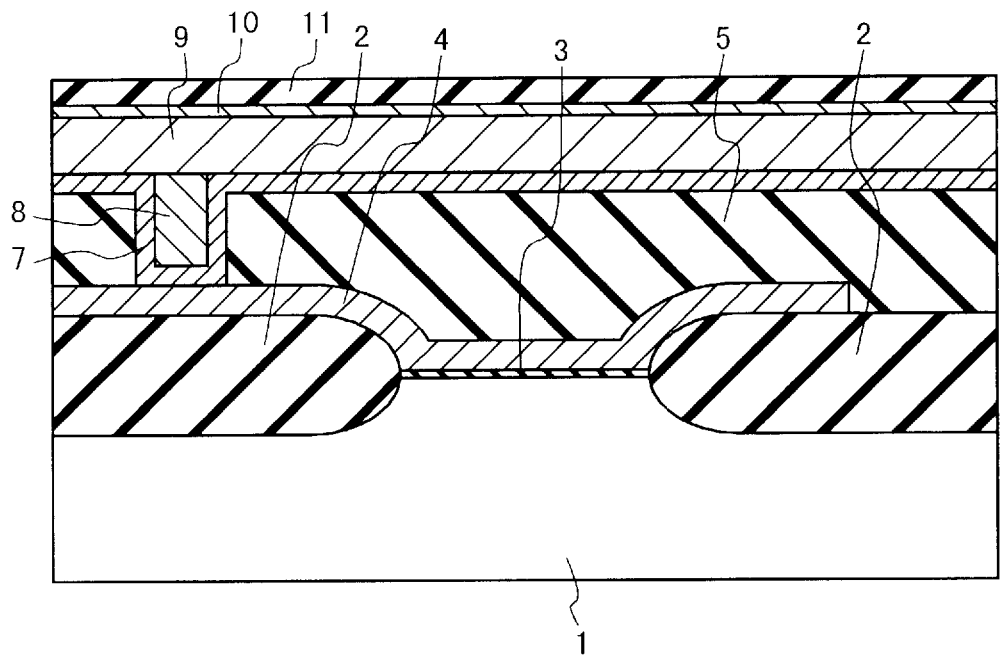

Next, as shown in FIG. 4C, an aluminium film 9 with the film thickness of 500 nm is formed as a wiring film, and then a titanium nitride film 10 with the film thickness of 50 nm is formed as a reflection preventing film on the aluminium film 9. Subsequently, a silicon oxide film 11 with the film thickness of 200 nm is formed.

Figure 4D:
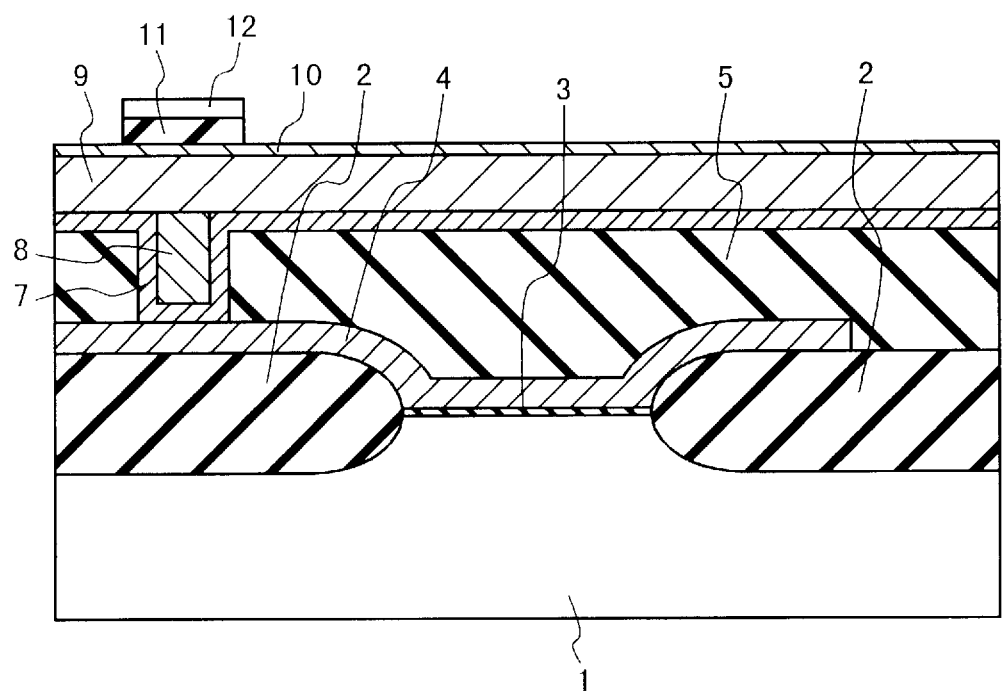

Next, as shown in FIG. 4D, a photo-resist film 12 is applied or coated onto the surface of the silicon oxide film 11. Subsequently, the silicon oxide film 11 is patterned by use of the photolithography technique and anisotropic etching.

Figure 4E:
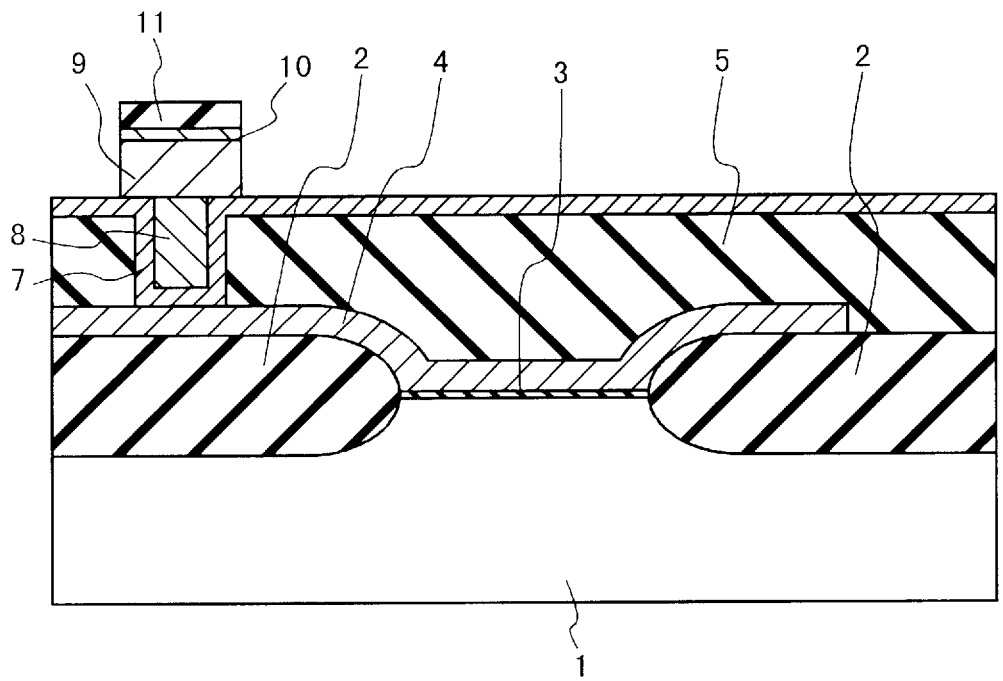

Next, as shown in FIG. 4E, after the photo-resist film 12 as the top layer is removed, the titanium nitride film 10 and the aluminium film 9 are patterned by use of an anisotropic plasma etching method, using the silicon oxide film 11 as a mask. In this case, when the etching reaches the titanium nitride film 7 as a lower layer, the etching is stopped to leave the titanium nitride film 7 on the BPSG film. The conductive layer has the laminate structure in which different metal layers are laminated. Therefore, if change of metal species can be detected from material of the etched film by a detector (not shown) during the etching in the perpendicular direction, i.e., in the film thickness direction. In this way, the stop of the etching can be easily detected, compared with the case of a single metal layer. Because the wiring patterns are electrically connected by use of the titanium nitride film 7, the charge generated by the plasma in the above-mentioned etching runs away to the substrate. Therefore, the gate oxide film 3 is not degraded nor destructed by the plasma damage.

Figure 4F:
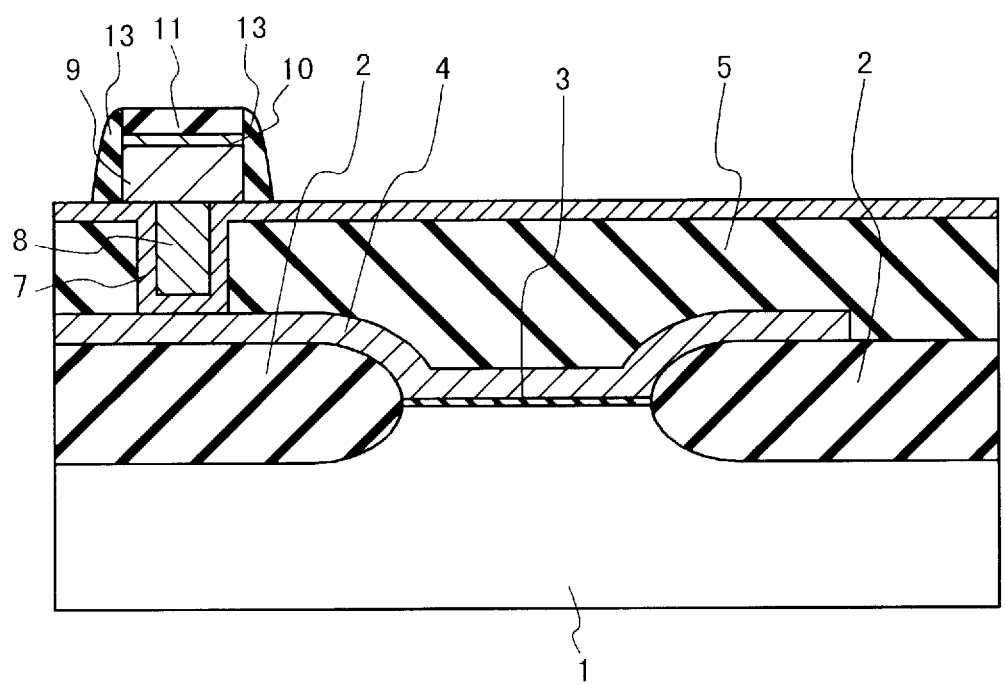

Next, as shown in FIG. 4F, a silicon oxide film is deposited to have a 100-nm film thickness, and then the silicon oxide film is etched back to form side wall insulating films 13 such that the side walls of the wiring pattern are covered by the insulating films 13.

Next, as shown in FIG. 4G, the exposed part of the titanium nitride film 7 is anisotropically etched by a plasma etching method using the side wall insulating films 13 and the silicon oxide film 11 as a mask, so that the wiring patterns are separated from each other. In this case, like the first embodiment, the titanium nitride wiring patterns are separated or patterned after the side wall insulating films 13 of silicon oxide are formed. Therefore, the side areas of the wiring patterns exposed to the plasma are very small when over-etching is performed. Thus, the plasma damage of the gate oxide film 3 can be remarkably reduced.

Figure 5A:
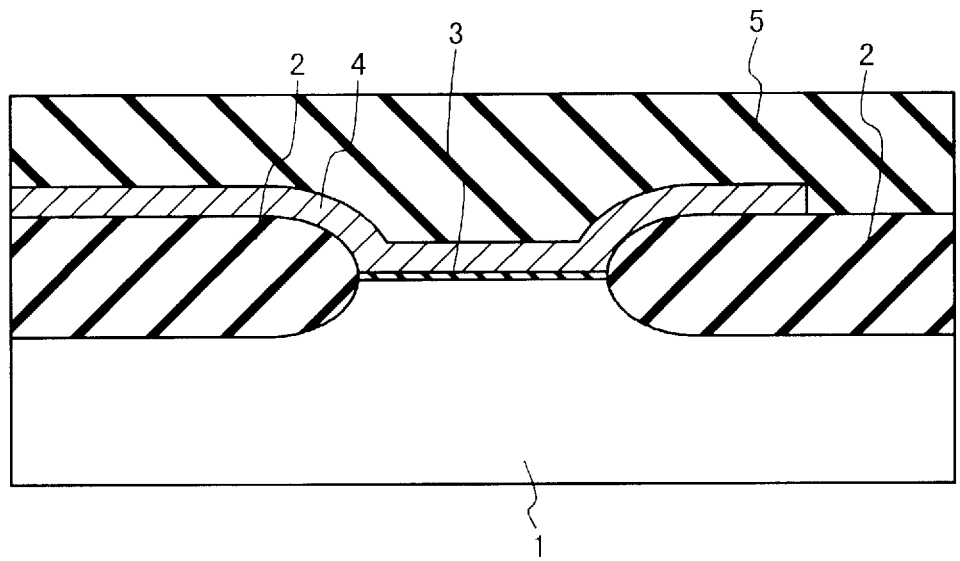
FIGS. 5A to 5G are cross sectional views which show a manufacturing method of a semiconductor device according to the third embodiment of the present invention.
Figure 5B:
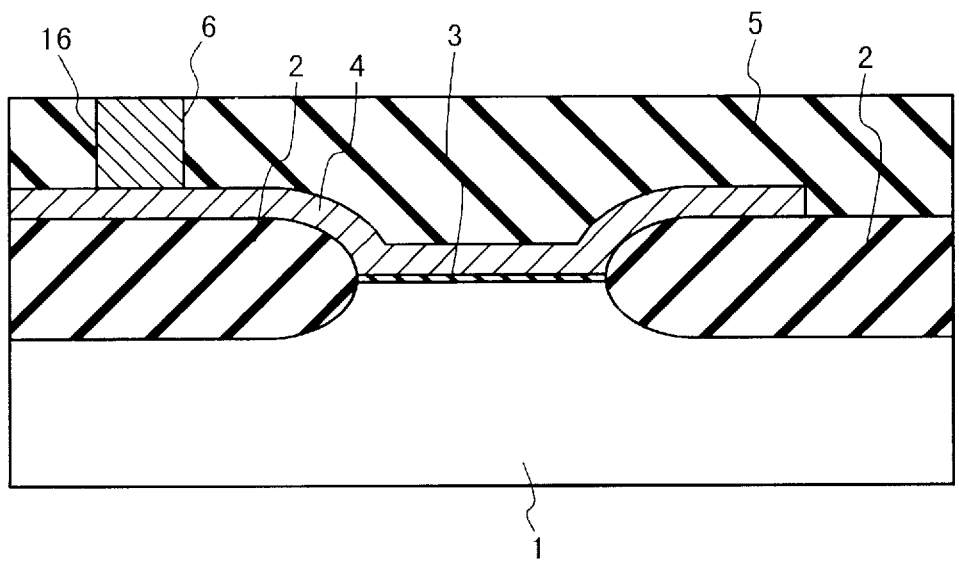
Figure 5C:
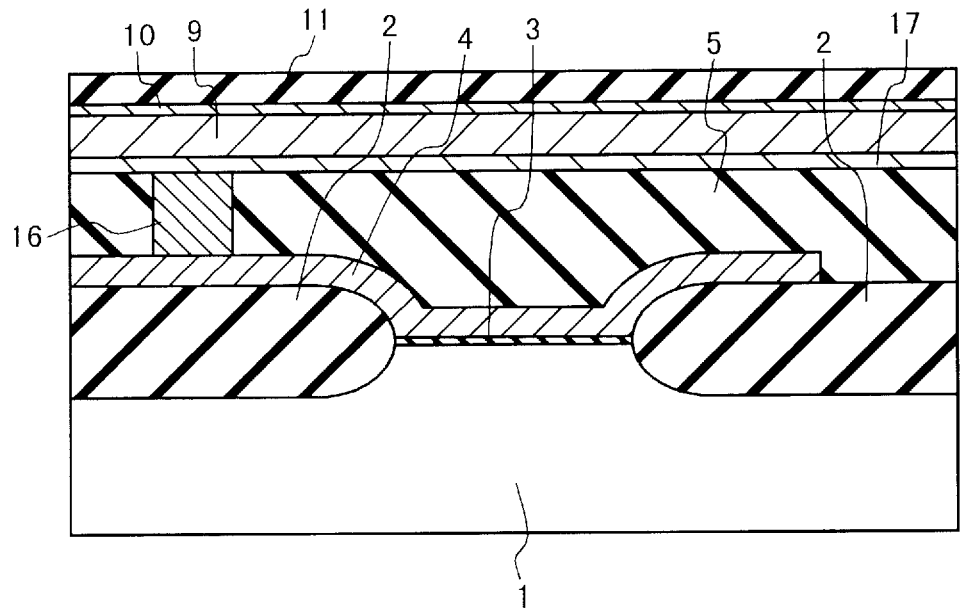
Figure 5D:
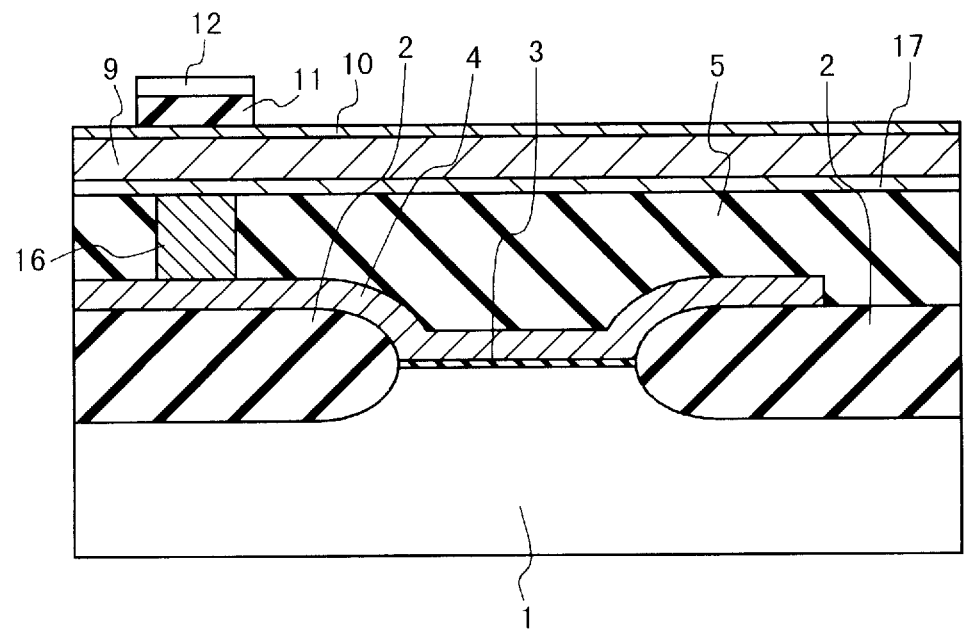
Figure 5E:
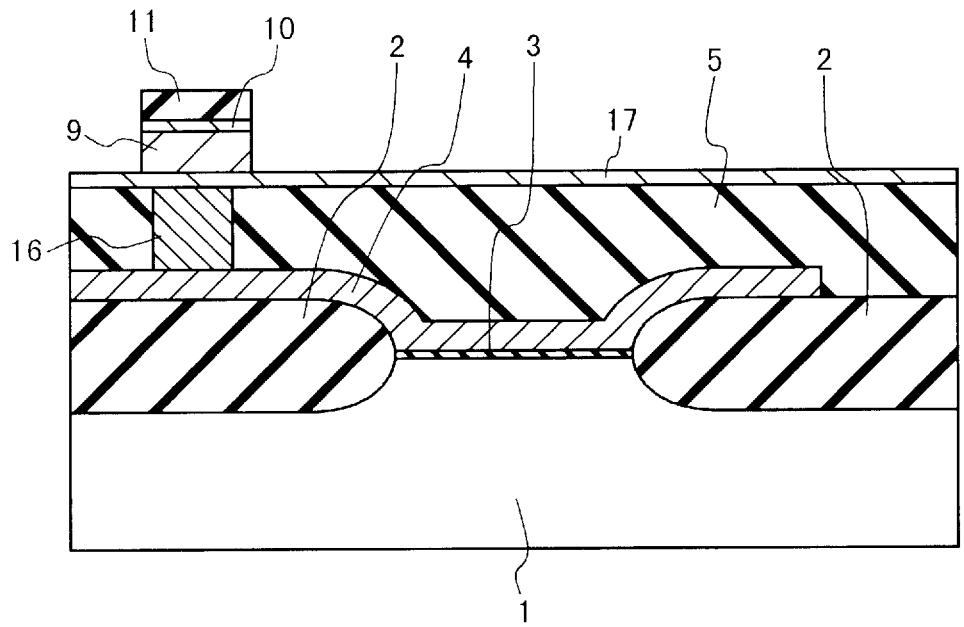
Figure 5F:
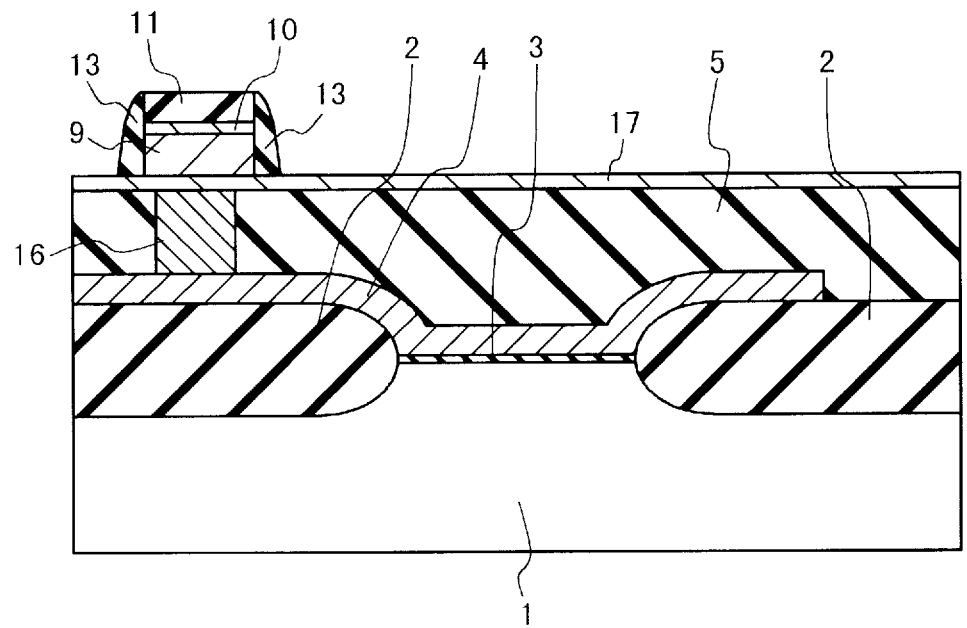
Figure 5G:
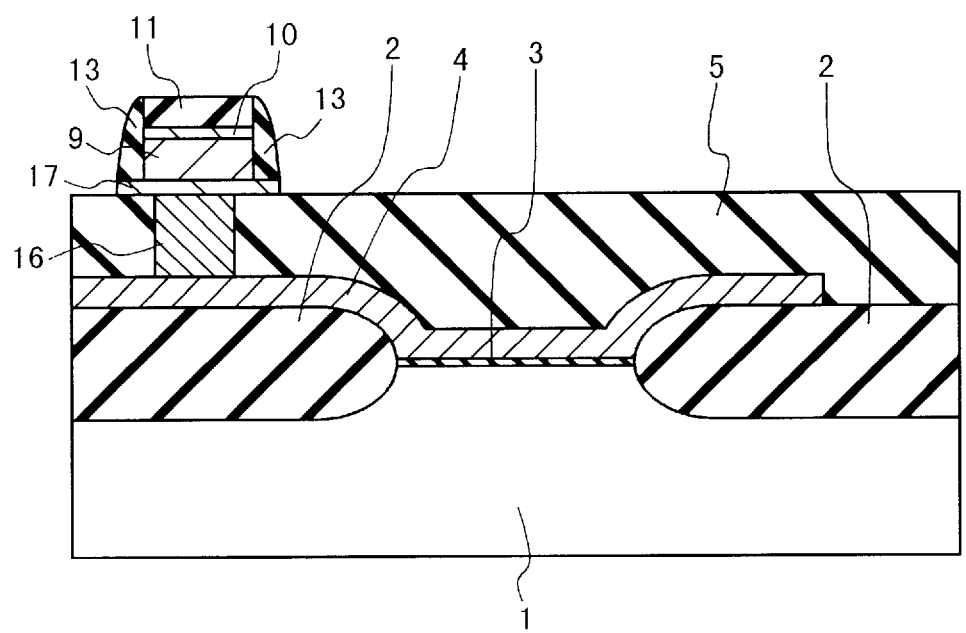

Next, the manufacturing method of a semiconductor device according to the third embodiment of the present invention will be described below with reference to FIGS. 5A to 5G. In the third embodiment, the processes shown in FIGS. 5A and 5B are the same as those shown in FIGS. 3A and 3B. However, in this case, the contact hole 6 is filled with a single conductive film 16. In this case, the contact hole 6 may be filled with a laminate conductive film 16. Subsequently, a titanium nitride film 17 is formed on the BPSG film 5 and the contact filled with the film 16. As a result, the structure can be obtained similar to the structure shown in FIG. 4B. In this case, the surface of the contact is also covered with the titanium nitride film 17. Subsequent processes shown in FIGS. 5C to 5G which are the same as those shown in FIGS. 4C to 4G in the second embodiment are performed.

According to the above-mentioned embodiments, the wiring forming process of the first wiring layer section is described. However, the similar method can be applied to the wiring forming process of the second wiring layer section and the subsequent. Also, aluminium is used as the wiring material but the wiring material is not limited to aluminium. The wiring layer may be a single layer.

Further, according to the second embodiment, because completion of the etching can be easily detected, the lower layer conductive film of titanium nitride can be accurately left. The lower layer conductive film may be a lamination film such as the titanium film and the titanium nitride film. Because the semiconductor device of the present invention is composed as described above, the present invention has the excellent effect as mentioned below. In the manufacturing method of the present invention, it is not necessary to add a function element like a protection diode. Therefore, there is not the increase of a layout area for the plasma damage prevention, and also the circuit design is not limited. Moreover, the plasma damage can be restrained only by adding several processes such as the growth and etching back of the silicon oxide film without adding a lithography process.

In addition, the manufacturing method of the present invention can be applied to the formation of wiring patterns having a fine separation by use of anisotropic etching.

What is claimed is:

1. A method of manufacturing a semiconductor device, comprising the steps of:

forming a conductive film for a plurality of wiring patterns on a first insulating film;

forming a second insulating film on said conductive film;

patterning said second insulating film to be adaptive for said plurality of wiring patterns;

anisotropically etching said conductive film using the patterned second insulating film a mask such that a part of said conductive film is remained in a thickness direction of said conductive film;

forming side wall insulating films on side walls of said etched conductive film; and completely patterning said conductive film for said plurality of wiring patterns using said side wall insulating films and said patterned second insulating film as a mask.

2. A method according to claim 1, wherein said step of anisotropically etching said conductive film includes stopping said etching when said etching is performed by a predetermined depth with respect to a film thickness of said conductive film.

3. A method according to claim 1, wherein said step of forming a conductive film includes:

forming a first conductive layer on said first insulating film; and forming a second conductive layer on said first conductive layer.

4. A method according to claim 3, wherein said first conductive layer is formed of aluminium.

5. A method according to claim 3, wherein said second conductive layer functions as a reflection preventing film.

6. A method according to claim 3, wherein said second conductive layer is formed of titanium nitride.

7. A method according to claim 1, further comprising the steps of:

forming a contact hole to pass through said first insulating film to another conductive layer which is formed under said first insulating film; and filling said contact hole with a contact conductive film such that said other conductive layer can be connected to said conductive film.

8. A method according to claim 1, wherein said step of forming a conductive film includes:

forming a first conductive layer on said first insulating film;

forming a second conductive layer on said first conductive layer; and forming a third conductive layer of said second conductive layer.

9. A method according to claim 8, wherein said step of anisotropically etching said conductive film includes stopping said etching when said etching reaches said first conductive layer.

10. A method according to claim 8, wherein said second conductive layer is formed of aluminium.

11. A method according to claim 8, wherein said third conductive layer functions as a reflection preventing film.

12. A method according to claim 8, wherein said first and third conductive layers are formed of titanium nitride.

13. A method according to claim 8, further comprising the steps of:

forming a contact hole to pass through said first insulating film to another conductive layer which is formed under said first insulating film; and filling said contact hole with a contact conductive film, wherein said first conductive layer is a part of contact conductive film.

14. A method of manufacturing a semiconductor device, comprising the steps of:

forming a first insulating film on a first conductive film;

forming a contact hole to pass through said first insulating film to said first conductive film;

filling said contact hole with a contact conductive film;

forming a second conductive film for a plurality of wiring patterns on said first insulating film and said contact hole filled with said contact conductive film;

forming a second insulating film on said second conductive film;

patterning said second insulating film to be adaptive for said plurality of wiring patterns;

anisotropically etching said second conductive film using the patterned second insulating film a mask such that a part of said second conductive film is remained in a thickness direction of said second conductive film;

forming side wall insulating films on side walls of said etched second conductive film; and completely patterning said second conductive film for said plurality of wiring patterns using said side wall insulating films and said patterned second insulating film as a mask.

15. A method according to claim 14, wherein said step of anisotropically etching said conductive film includes stopping said etching when said etching is performed by a predetermined depth with respect to a film thickness of said second conductive film.

16. A method according to claim 14, wherein said step of forming a conductive film includes:

forming a first conductive layer on said first insulating film; and forming a second conductive layer on said first conductive layer as a reflection preventing film.

17. A method according to claim 16, wherein said first conductive layer is formed of aluminium.

18. A method according to claim 16, wherein said second conductive layer is formed of titanium nitride.

19. A method of manufacturing a semiconductor device, comprising the steps of:

forming a first insulating film on a first conductive film;

forming a contact hole to pass through said first insulating film to said first conductive film;

forming a first contact conductive film on said first insulating film such that said first contact conductive film covers a surface of said first conductive film within said contact hole and side walls of said contact hole;

filling a remaining portion of said contact hole with a second contact conductive film;

forming a second conductive film for a plurality of wiring patterns on said first contact conductive film;

forming a second insulating film on said second conductive film;

patterning said second insulating film to be adaptive for said plurality of wiring patterns;

anisotropically etching said second conductive film using the patterned second insulating film a mask;

stopping said etching when said etching is performed to said second conductive film to expose said first contact conductive film;

forming side wall insulating films on side walls of said etched second conductive film; and completely patterning said first contact conductive film for said plurality of wiring patterns using said side wall insulating films and said patterned second insulating film as a mask.

20. A method according to claim 19, wherein said step of anisotropically etching said second conductive film includes:

detecting a material of an etched film; and stopping said etching when it is detected that the material of the etched film is a material of said first contact conductive film.

21. A method according to claim 19, wherein said step of forming a second conductive film includes:

forming a first conductive layer of aluminium on said first contact conductive film; and forming a second conductive layer as a reflection preventing film on said first conductive layer.

22. A method according to claim 21, wherein said first contact conductive film and said second conductive layer are formed of titanium nitride.

* * * * *